(12) United States Patent
Caplet

(10) Patent No.: US 8,324,695 B2
(45) Date of Patent: Dec. 4, 2012

(54) ELECTRONIC COMPONENT WITH MECHANICALLY DECOUPLED BALL CONNECTIONS

(75) Inventor: Stephane Caplet, Sassenage (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 132 days.

(21) Appl. No.: 12/740,809

(22) PCT Filed: Nov. 6, 2008

(86) PCT No.: PCT/EP2008/065055
§ 371 (c)(1),
(2), (4) Date: Apr. 30, 2010

(87) PCT Pub. No.: WO2009/060029
PCT Pub. Date: May 14, 2009

(65) Prior Publication Data
US 2010/0244246 A1    Sep. 30, 2010

(30) Foreign Application Priority Data
Nov. 8, 2007 (FR) ..................................... 07 58879

(51) Int. Cl.
*H01L 29/82* (2006.01)
(52) U.S. Cl. ..................................... 257/415
(58) Field of Classification Search .......... 257/415–420, 257/E29.105, E21.002
See application file for complete search history.

(56) References Cited

U.S. PATENT DOCUMENTS
| 5,759,047 | A | 6/1998 | Brodsky et al. |
| 7,265,045 | B2 | 9/2007 | Lee et al. |
| 7,863,070 | B2 * | 1/2011 | Colgan et al. .................. 257/415 |
| 8,067,840 | B2 * | 11/2011 | Bielen et al. ................... 257/777 |
| 8,110,962 | B2 * | 2/2012 | Bauer et al. .................... 257/416 |
| 2003/0121698 | A1 | 7/2003 | Kyougoku et al. |
| 2009/0170312 | A1 | 7/2009 | Caplet |
| 2009/0261431 | A1 | 10/2009 | Caplet |
| 2010/0001361 | A1 | 1/2010 | Caplet et al. |

FOREIGN PATENT DOCUMENTS
DE         103 60 127 A1      7/2005
DE    10 2004 031 888 A1    10/2005

OTHER PUBLICATIONS

Kozo Harada, et al., "Analysis of Solder Joint Fracture Mechanical Bending Test", Electronic Components and Technology Conference, 2003, pp. 1731-1737.
Office Action issued Sep. 30, 2010, in European Patent Application No. 08 846 382.3.

* cited by examiner

*Primary Examiner* — Cuong Q Nguyen
(74) *Attorney, Agent, or Firm* — Oblon, Spivak, McClelland, Maier & Neustadt, L.L.P.

(57) ABSTRACT

An electronic component including at least one chip and/or one support, the chip configured to be transferred onto the support and linked, at a level of at least one connection site of the chip, formed by at least one portion of a layer of the chip, to at least one connection site of the support formed by at least one portion of a layer of the support, by at least one ball, the chip and/or the support including a mechanism for mechanical decoupling of the connection site of the chip and/or of the support with respect to the chip and/or to the support, which mechanism includes at least one cavity made in the layer of the chip and/or of the support, under the connection site of the chip and/or of the support, and at least one trench, made in the layer of the chip and/or of the support, communicating with the cavity.

28 Claims, 4 Drawing Sheets

ELECTRONIC COMPONENT WITH MECHANICALLY DECOUPLED BALL CONNECTIONS

TECHNICAL FIELD

The invention relates to the domain of electronic components comprising chips, or dies, that will be connected or coupled by "flip-chip" in other words by connection balls or microballs on a support such as an electronic printed circuit board.

Throughout this document, a chip should be taken to mean any electronic element using electrical connections, for example a MEMS (MicroElectroMechanical System), a NEMS (NanoElectroMechanical System), a MOEMS (MicroOpticalElectroMechanical System), an imager or a MOS circuit.

STATE OF PRIOR ART

The flip-chip ball or microball transfer technique consists of transferring a chip onto a support through several balls or microballs located on a front face of the chip and/or the support, for example around the periphery of this face. These balls are made from a meltable, or fusible, material such as gold and tin alloy.

The balls are heated to a temperature greater than or equal to the melting point of the material from which they are made, to transfer the chip onto the support. The chip is then brought above the support, the balls then forming solid connections between the chip and the support, after the meltable material has cooled.

When the coefficient of thermal expansion of the support material, for example a plastic material, a resin or even a PCB (polychlorobiphenyl) is not the same as the coefficient of thermal expansion of the material from which the chip is made (for example silicon, glass, etc.), and particularly when the chip is large or the balls are very small, mechanical stresses appear at these balls and/or inside the chip during cooling of the melting material from which they are made. In particular, these mechanical stresses can cause delamination at the liaison between the balls and the chip and/or between the balls and the support, thus weakening the connections made between the chip and the support.

PRESENTATION OF THE INVENTION

One purpose of this invention is to propose an electronic component comprising at least one chip and/or one support, and a method of making such a component, reducing mechanical stresses and particularly stresses that could cause delamination problems that occur at connection balls during the transfer of a chip onto the support.

To achieve this, this invention discloses a component, for example an electronic component, comprising at least one chip and/or one support, the chip being intended to be transferred onto the support and connected at least one connection location of the chip formed by at least one portion of a layer of the chip, to at least one connection location of the support formed by at least one portion of a layer of the support through at least one ball, the chip and/or the support comprising mechanical decoupling means of the chip and/or the support connection location from the chip and/or the support, formed by at least one cavity, for example buried, made in the layer of the chip and/or the support, under the connection location of the chip and/or the support, and at least one trench made in the layer of the chip and/or the support communicating with said cavity. Said trench may partly surround said portion of the layer such that at least one zone of said layer connects said portion of the layer to the remainder of this layer and being made from at least one non-metallic material. Said zone then forms part of the mechanical decoupling means.

Thus, mechanical decoupling is made at one or several of the connection locations or contact bumps, in other words at locations that will receive the connection balls, of the chip and/or the support. This mechanical decoupling will thus "absorb" or compensate for all or some of the mechanical stresses that appear particularly during cooling of the meltable material of the connection balls due to the mechanical decoupling means formed by one or several trenches and cavities made at the connection location(s), particularly reducing risks of delamination at the interfaces between the balls and the support and/or between the balls and the chip. The result is thus that a flexible zone is formed connecting the portion of the layer that will hold the connection ball to the remainder of this layer at one or several connection locations of the chip and/or the support. These flexible zones form mechanical stress absorption zones called "beam springs".

This mechanical decoupling may be achieved at all connection locations of the chip and/or the support that will hold a connection ball, or in only some of these locations. In particular, mechanical decoupling may be made at critical locations, in other words locations that may be affected by the main mechanical stresses during assembly of the chip with the support, such as locations at the periphery of the chip close to the external edges of the chip.

The invention is particularly applicable for chips for which the side dimensions are for example greater than about 5 mm and/or that use small connection balls, for example smaller than about 100 μm.

This mechanical decoupling also provides a means of mechanically filtering vibrations from the electronic component. The stiffness of the connection between the support and the chip may be calibrated by varying the number, shape and dimensions of the trench(es) and the decoupling cavity(ies) made at connection locations, so that the passband for the component can be adjusted. For example, when a resonant frequency of the component is to be measured within a precise frequency range, mechanical decoupling makes it possible to filter applied frequencies or frequencies generated by the component outside this range.

The trench may be arranged around the periphery of the chip connection location and/or the support connection location.

The trench may make the cavity communicate with one face of the layer of the chip and/or the support.

The portion of the chip layer and/or the portion of the support layer may be approximately polygonal in shape, for example rectangular, or it may be in the shape of a disk in a plane parallel to a principal plane of the chip layer and/or the support layer.

The trench may for example comprise a shape chosen from among a rectangular pattern and a circle arc pattern in a plane parallel to a principal plane of the chip layer and/or the support layer.

The mechanical decoupling means may for example comprise at least four trenches made in the chip layer and/or the support layer, making the cavity communicate with a face of the chip layer and/or the support layer.

The trench may comprise at least one comb pattern. Thus, the decoupling means may include viscous damping comb type patterns, in other words comprising one or several trenches forming at least one damping comb in which there is a fluid, for example oil, with a viscosity such that the component is not resonant.

The trench may comprise a pattern formed from one or two circle arcs connected to each other at one end, in a plane parallel to a principal plane of the chip layer and/or the support layer.

In general, the shape, dimensions and number of trenches used depend on envisaged applications and particularly directions of stresses applied at each chip and/or support connection location during the transfer of the chip onto the support. Thus, trenches capable of compensating for all or some of these stresses can be made along one or several preferred directions, possibly with a specific pattern at each connection location depending of the force and direction of the stresses applied at each connection location.

According to the invention, the mechanical decoupling means may also comprise at least one plastic and/or viscous material arranged in all or part of the cavity and/or the trench. This plastic and/or viscous material may perform several functions. In particular, it can protect the inside of the cavity and/or the trench particularly during brazing of the meltable material of the connection ball. It can also enable mechanical frequency filtering by the absorption of some frequency ranges, particularly high frequencies for example due to parasite vibrations. In all cases, this plastic and/or viscous material does not eliminate the mechanical decoupling function performed by the cavity and the trench. For example, a plastic material may be a resin, and a viscous material may be oil. This plastic and/or viscous material may form part of the mechanical decoupling means according to the invention. A plastic and/or viscous material means a material with a capability of deformation that in particular does not hinder mechanical decoupling of connection locations.

The connection location of the chip and/or the connection location of the support may comprise at least one portion of an electrically conducting material, for example metal-based, arranged on the portion of the chip and/or the support layer, directly or through an appropriate interface material, for example on the side of said face of the layer.

The portion of conducting material may form an electrical contact between at least two elements of the component. These elements may for example be microelectronic devices such as transistors or any other active or passive components, and/or MEMS, and/or NEMS, and/or MOEMS.

The component may also comprise at least one metallic track made on the chip and/or the support, and electrically connected to the portion of the conducting material.

The portion of conducting material may form at least one part of an electrical contact between the chip and the support.

The chip may comprise at least one MOS type device and/or at least one MEMS and/or at least one NEMS and/or at least one MOEMS, for example made in the chip layer.

The chip may be electrically connected to the support through the ball.

According to the invention, the mechanical decoupling means may perform mechanical filtering between the chip and the support.

The chip may be made from a material for which the coefficient of thermal expansion is different from the coefficient of thermal expansion of the material from which the support is made.

The electronic device may also comprise a material embedding the component, in other words the chip and/or the support, for example a polymer or a resin. This material protects the component without eliminating the mechanical decoupling function performed by the mechanical decoupling means. The embedding material may or may not be similar to the plastic and/or viscous material that may be placed in the trench and/or the cavity.

The non-metallic material of said zone of the layer or "beam spring" zone may comprise silicon and/or silicon oxide and/or silicon nitride.

The non-metallic material in said "beam spring" zone may also comprise doped silicon with a resistivity of less than about 1 Ohm·cm.

This invention also relates to a method of making an electronic component comprising at least one chip and/or one support, the chip being intended to be transferred onto the support and connected, at least one connection location of the chip, to at least one connection location of the support through at least one ball, comprising the following steps:
  make at least one trench in at least one first layer, communicating with at least part of a sacrificial layer placed in contact with the first layer.
  eliminate the part of the sacrificial layer forming at least one cavity arranged under at least one portion of the first layer corresponding to the chip connection location and/or the support connection location;
  the trench and the cavity forming mechanical decoupling means of the chip connection location and/or the support connection location from the chip and/or the support.

The invention also relates to a method for making a component comprising at least one chip and/or one support, the chip being intended to be transferred onto the support and connected to at least one support connection location at least one chip connection location, through at least one ball, comprising at least the following steps:
  make at least one trench in at least one first layer, communicating with at least one part of a sacrificial layer arranged in contact with the first layer and partly surrounding a portion of the first layer such that at least one zone of said layer connects said portion of the layer to the rest of this layer;
  eliminate part of the sacrificial layer forming at least one buried cavity and arranged under at least the portion of the first layer corresponding to the chip connection location and/or the support connection location;
  the trench, cavity and said zone of the layer forming the mechanical decoupling means of the chip connection location and/or the support connection location from the chip and/or the support, said zone of the layer being made from at least one non-metallic material.

The method may also comprise a step to make a portion of a conducting material arranged on the portion of the first layer, for example on the side of a face of the first layer communicating with the cavity through the trench.

The method may also comprise a cavity and/or trench filling step with a plastic and/or viscous material, between the step to eliminate the part of the sacrificial layer and the step to transfer the chip onto the support.

The method may also comprise a step to deposit a coating resin on the electronic component, after the step to transfer the chip onto the support.

This invention may also relate to a mechanical filtering method between at least one support and one chip, as described above, coupled to the support.

BRIEF DESCRIPTION OF THE DRAWINGS

This invention will be better understood after reading the description of example embodiments given purely for guidance and in no way limitative with reference to the appended drawings in which.

Identical, similar or equivalent parts of the different figures described below are assigned the same reference numbers to facilitate the comparison between one figure and another.

The different parts shown in the figures are not necessarily at the same scale, to make the figures more easily readable.

The different possibilities (variants and embodiments) shall be understood as being not mutually exclusive and they can be combined together.

DETAILED PRESENTATION OF PARTICULAR EMBODIMENTS

Figure 1:
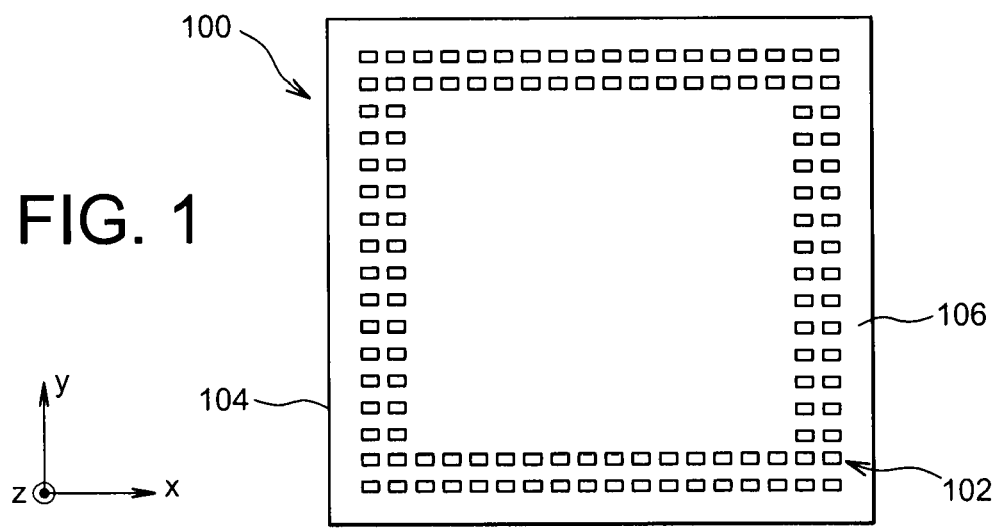
FIG. 1 shows a top view of a chip with mechanically decoupled connection locations, according to a first embodiment of this invention.
Figure 2:
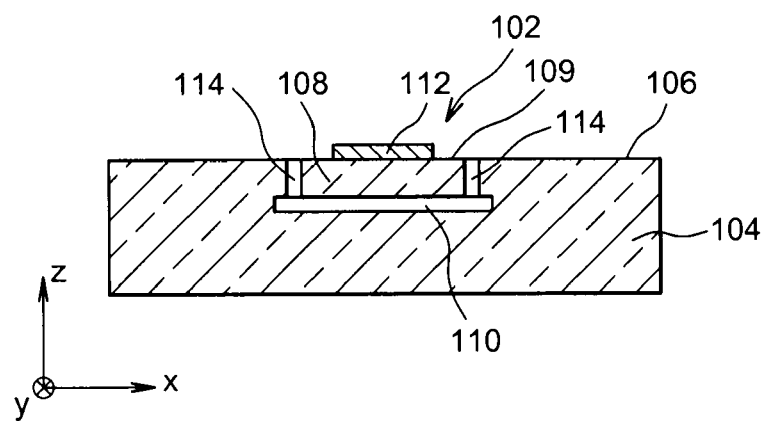
FIGS. 2 and 3A respectively show a sectional view and a top view of a first example of a mechanically decoupled connection location of a chip.
Figure 3A:
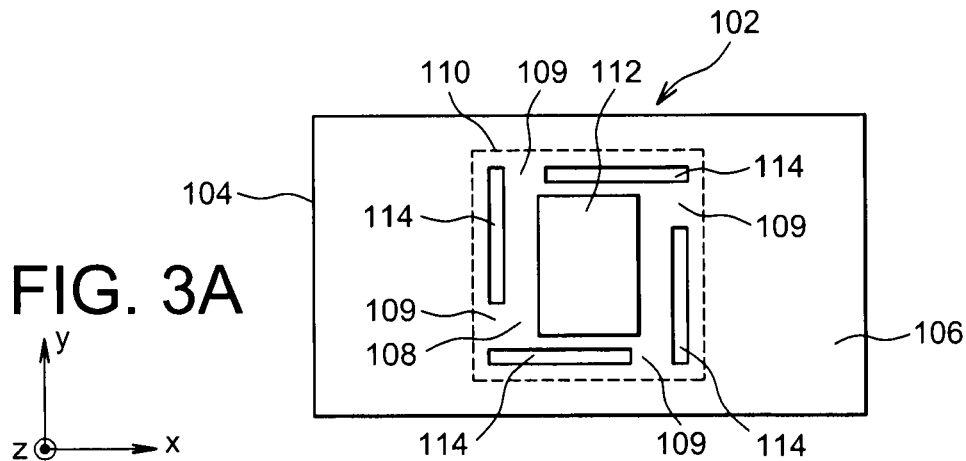

With reference firstly to FIG. 1 that shows an example of a chip 100 comprising a plurality of connection locations 102 according to a first embodiment. FIGS. 2 and 3A respectively show a sectional view and a top view of a first example of one of these connection locations 102.

The chip 100 comprises a layer 104, for example made from at least one semiconductor such as silicon. In particular, this layer 104 may be an active layer of the chip 100. One or several microelectronic devices such as MOS devices or MEMS, not shown, may in particular be made on this active layer 104. In this case, the connection locations 102 are made on a face 106 of the active layer 104. In the example of the chip 100 shown in FIG. 1, the connection locations 102 are made around the periphery of the active layer 104, in other words close to the outside edges of the layer 104 in a pattern forming two concentric rectangles.

Each connection location 102 is formed by a portion 108 of the active layer 104. A cavity 110, in this case buried in the layer 102, is made under each of the portions 108 of the active layer 104. Each portion 108 may be delimited in a plane parallel to the (x,y) plane, the principal plane of the active layer 104, from the remainder of the active layer 104 by the pattern in the cavity 110. The cavity 110 in the example in FIGS. 2 and 3 is rectangular in shape.

Each connection location 102 also comprises a portion 112 of a conducting material, for example a metal such as gold, that will hold a connection ball. Each connection location 102 may also comprise an under bump metallisation (UMB) layer, not shown in the figures described herein, on portion 112. In the example of FIGS. 2 and 3A, the conducting portion 112 is centred on the centre of the cavity 110. Finally trenches 114 (there are four rectangular trenches in this case) are made in the portion 108 and make the cavity 110 communicate with the outside face 106 of the active layer 104. In the location example 102 described with reference to FIGS. 2 and 3A, the trenches 114 are made around the periphery of the portion 108, thus surrounding this portion 108, and are parallel in pairs. Each trench 114 forms a rectangle in a plan parallel to the (x,y) plane, the larger side of the rectangle being parallel to one of the sides of the rectangle formed by the cavity 110 in a plane parallel to the (x, y) plane. Therefore in this case, the cavity 110 and the trenches 114 form means of mechanically decoupling the connection location 102 from the chip 100.

FIG. 3A shows that the trenches 114 only partly surround the portion 108. Zones 109, called beam spring zones, each located between two trenches 114, connect the portion 108 to the remainder of the layer 104. Thus, the beam spring zones 109 are capable of mechanically absorbing stresses that can appear at the portion 108 due to mechanical decoupling between the portion 108 and the remainder of the active layer 104.

The chip 100 may also be made such that these beam spring zones 109 are formed in the active layer 104 for which the predominant material (in other words that forms a large part of the layer 104) may be a material capable of absorbing high mechanical stresses without breaking. The size of the beam spring zones 109 (in other words the distance between two trenches 114 that delimits one of the zones 109 and the thickness of the portion 108) may be determined to give high mechanical flexibility in the (x,y) plane and also along the z axis, in other words for example they may be capable of deforming by a few tens of micrometers, for example up to 50 or 90 μm, without breaking. Such a non-metallic material may be silicon, for example monocrystalline silicon, silicon oxide or silicon nitride or even doped silicon.

Figure 3B:
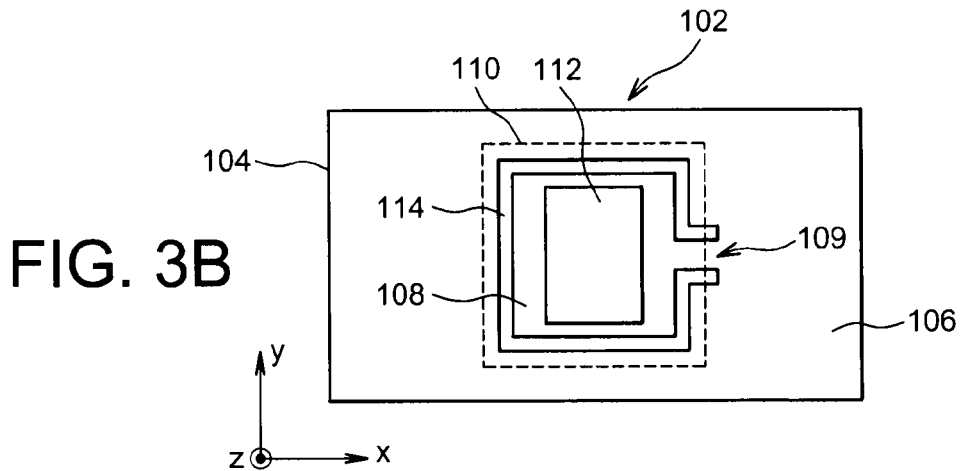
FIG. 3B shows a top view of a variant of the first example of a mechanically decoupled connection location of a chip.

FIG. 3B shows a variant of the first example connection location 102. Unlike FIG. 3A, only one trench 114 is made around the periphery of the portion 108. Therefore unlike FIG. 3A, the portion 108 is connected to the remainder of the layer 104 at a single zone 109 capable of absorbing stresses along the direction of the y vector shown in FIG. 3B.

Figure 4A:
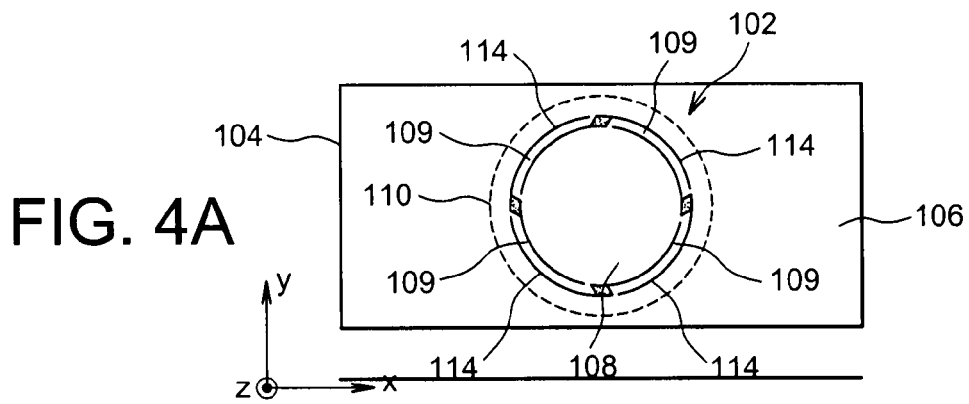
FIG. 4A shows a top view of a second example of a mechanically decoupled connection location of a chip.

FIG. 4A shows a top view of a second example connection location 102 mechanically decoupled from the chip 100. Unlike the first example in FIGS. 2, 3A and 3B, this second example comprises a cylindrical shaped cavity 110. The portion 108 of the active layer 104 is also cylindrical in shape. In this second example connection location 102, four trenches 114 were made in the portion 108, making the cavity 110 communicate with the face 106 of the active layer 104. Unlike the first example in FIGS. 2 and 3, in this case each trench 114 forms a pattern in the (x,y) plane formed from two circle arcs connected to each other at one end through a parallelogram. These two circle arcs are arranged on two circles with distinct diameters with the centre in this example coincident with the centre of the cavity 110. Beam spring zones 109, in other words mechanical stress absorption zones, are located between two circle arcs in two adjacent trenches 114. A portion of conducting material, not shown in the example in FIG. 4A, may also be arranged on the portion 108 of the active layer 104.

Figure 4B:
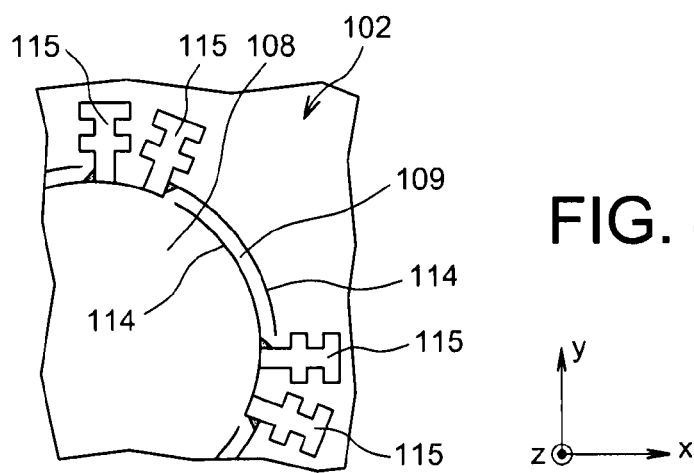
FIG. 4B shows a partial top view of a variant of the second example of a mechanically decoupled connection location of a chip.

FIG. 4B shows a partial top view of a variant of the second example connection location 102 described above with reference to FIG. 4A. In this variant, each trench 114 forms a pattern in an (x, y) plane formed by two circle arcs connected to each other at one end through at least one interdigitated comb, for example two interdigitated combs 115 as shown in FIG. 4B.

In general, the number of trenches made in the active layer, the shape of these trenches and the general pattern formed by the trenches may be different from the examples described above. It is also possible that mechanical decoupling of a connection location is formed partly by several cavities made in the layer 104.

During connection of the chip 100 onto a support, for example onto a printed circuit board (PCB), connection balls are deposited or formed by deposition and remelting on the connection locations 102, particularly on conducting portions 112. These connection balls are made from a meltable material such as gold and tin alloy, or tin and lead alloy, or indium and tin alloy. They are heated to a temperature greater than or equal to the melting point of the meltable material, and the meltable material becomes solid again as it cools, thus brazing the balls to the conducting portions 112. The chip 100 may then be connected to the printed circuit board by bringing it into contact with the printed circuit board through the connection balls, and then brazing the balls between the chip 100 and the printed circuit board. The balls may also be placed firstly on the printed circuit board, and the chip 100 may then be connected to the printed circuit board by brazing the connection balls. It would also be possible to distribute the connection balls on both the chip and the support before connecting the chip onto the support.

The cavities 110, the trenches 114 and the beam spring zones 109 provide mechanically decoupling at each connection location 102. If the coefficient of thermal expansion of the material of the printed circuit board or more generally the material of the support on which the chip 100 will be connected by flip-chip, is different from that of the layer 104 (for example coefficient of thermal expansion of silicon=3 ppm/° C.; coefficient of thermal expansion of the resin in the printed circuit board=19 ppm/° C.), the mechanical stresses applied to the connection balls are then dissipated due to this mechanical decoupling, in particular eliminating the risk of delamination of the connection balls during cooling of the metal.

In the example embodiment described with reference to FIG. 1, all connection locations 102 are made according to the example described with reference to FIGS. 2, 3A and 3B or FIG. 4A or 4B, in other words each of them comprises one or several cavities, one or several trenches and beam spring zones connecting the portion forming the connection location to the remainder of the active layer, forming mechanical decoupling means. However, it is possible that only part of the connection locations 102 comprises these mechanical decoupling elements, the other connection locations 102 not comprising trenches or cavities made under the portion of active layer forming the connection location. For example, these mechanical decoupling elements may be restricted to "critical" connection locations. For example, in the example shown in FIG. 1, mechanical decoupling elements may be restricted to connection locations forming the rectangle closest to the outside edges of the layer 104.

Furthermore, in the examples described above, only the chip connection locations are mechanically decoupled. In one variant, all support connection locations, or some of these connection locations that will hold connection balls may be mechanically decoupled from the support. This mechanical decoupling of support connection locations is made in a similar manner to the examples described above (one or several cavities and trenches are made in the support layer). Thus, connection locations may be mechanically decoupled at the support and/or the chip.

The conducting portions 112 may also make electrical contact bumps for example that enable circulation of electrical signals between the chip 100 and the support to which the chip 100 is connected through connection balls and/or between different elements of the chip 100 and/or the support through metallic tracks made on the chip 100 and/or on the support, and connected to the conducting portions 112. In particular, these tracks may connect different elements of the chip 100 to each other, for example microelectronic devices and/or MEMS. Metallic interconnection tracks may also be made on the side of the support that does not contain the chip 100 and/or be embedded in the layer 104 of the chip 100 or in the support.

Apart from their mechanical decoupling function, the trenches 114, the cavities 110 made in the active layer 104 and the beam spring zones 109 may also perform mechanical filtering. For example, this filtering is useful if it is required to measure a resonant frequency of the chip or a component made on the chip, which may be a MEMS, within a certain frequency range. In this case, by calibrating the stiffness of the connection between the chip and the support onto which the chip is transferred using the geometry of the trenches and the cavities, and possibly by adding a damping function due to the introduction of a plastic and/or viscous material in the trench(es) and cavity(ies), it would then be possible to filter frequencies beyond the frequency range in which the measurement is to be made, thus for example avoiding parasite resonance phenomena in the chip 100. Viscous type damping may be created by varying the plasticity or viscosity of the material, for example oil, placed in the trenches. When the trenches are filled and not the cavity, a given material, for example a resin, is used and the width of the trenches is varied. If the trenches and the cavity are both filled, then a fluid is used in preference, for example oil.

After the step in which the chip 100 is transferred onto the printed circuit board, a resin embedding the assembly formed by the transferred chip 100 and the support may be deposited. In particular, this resin may fill the trenches and/or cavities made at the connection locations 102. In this case, the resin is chosen such that it can act as an absorber (or damper) of vibrations applied to the chip and/or the support. This material may be a coating resin. When a fluid is placed in the trench(es) or in the cavity(ies) forming mechanical decoupling means, the chip and support assembly is preferably coated to maintain this fluid in its location.

Figure 5:
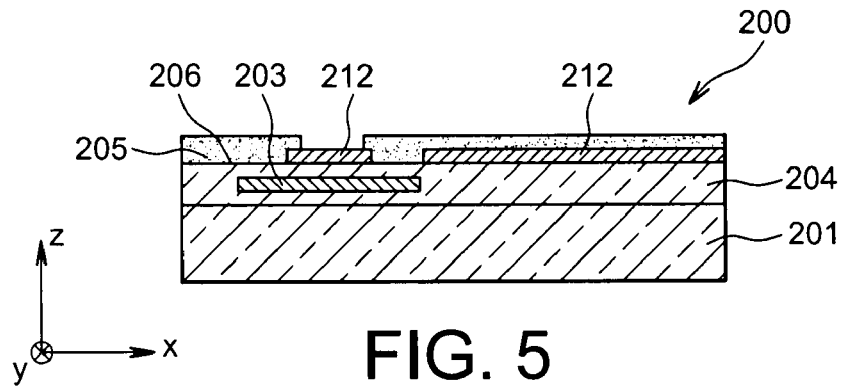
FIGS. 5 to 7 show steps in the method for making a chip with mechanically decoupled connection locations according to a second embodiment of this invention.
Figure 6:
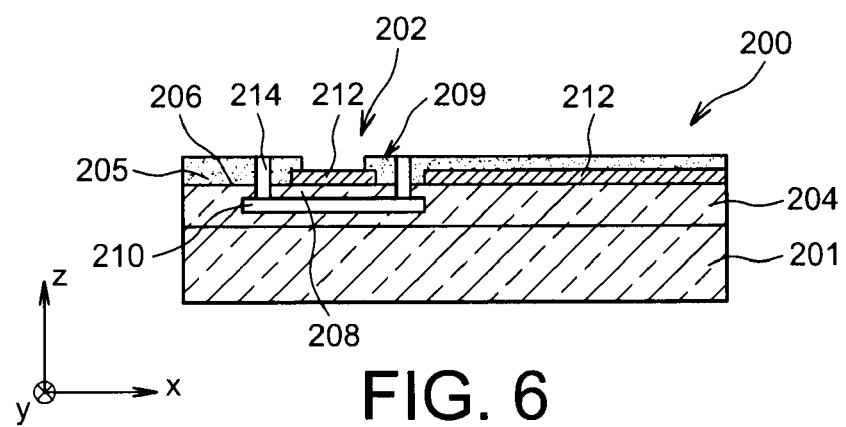
Figure 7:
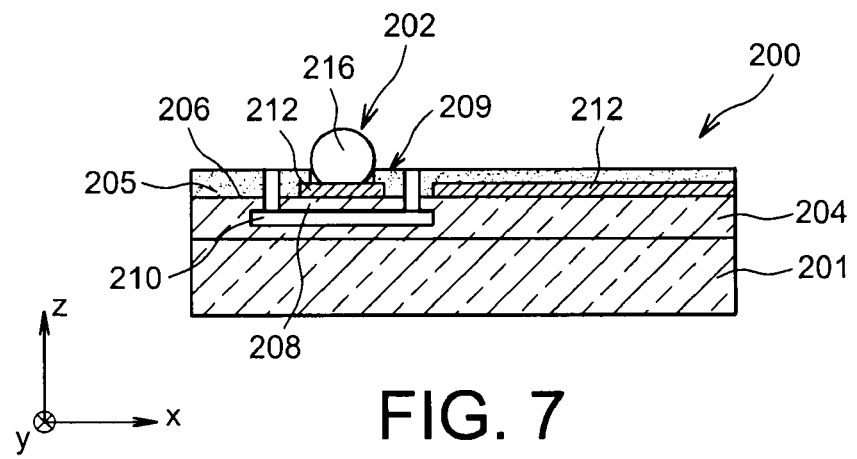

We will now refer to FIGS. 5 to 7 showing the steps of a second embodiment of a method to make a chip 200 with mechanically decoupled connection locations.

In this embodiment, the chip 200 is made for example using a CMOS technology starting from a silicon substrate 201 on which a metallic interconnection layer 204 is made based on silicon oxide and metal. CMOS devices, not shown, and metallic interconnection layers are made according to a standard CMOS method. FIG. 5 shows a part of a lower metallic layer 203 and a part of an upper metallic layer 212 in particular. Finally, a passivation layer 205, for example based on silicon nitride, may be deposited on a face 206 of the layer 204 and on the upper metallic layer 212 also located on the face 206 of the layer 204. This passivation layer 205 may comprise an opening in the metal 212. An additional UBM layer may also be deposited on the passivation layer 205 and/or on the metallic layer 212.

As shown in FIGS. 6 and 7, connection locations 202 of the chip 200 are made on the face 206 of the layer 204. As for the chip 100 described above, the connection locations 202 are preferably made around the periphery of the layer 204, in other words close to the outside edges of the layer 204.

This is done by lithography and etching of trenches 214, for example with a geometry similar to the geometry of the trenches 114 described above, in the active layer 204 and the passivation layer 205. These trenches 214 provide an access to an isolated pattern of the lower metallic layer 203 that is used in this case as the sacrificial layer. The portion of the lower metallic layer 203 is then etched to form a cavity 210 under a portion 208 of the layer 204. Zones 209 connecting the portion 208 to the remainder of the layer 204 are obtained in the layers 204 and 205 forming beam spring zones similar to the zones 109 mentioned above. This sacrificial etching may be done by wet etching, for example HCl (hydrogen chloride) type etching. As for the chip 100 described above, the cavity 210 delimits the portion 208 forming a connection location relative to the remainder of the active layer 204 and the passivation layer 205, in a plane parallel to the (x,y) plane. In one variant, the zones 209 may be formed only in the layer 204. In this case, the passivation layer 205 is opened in advance, for example by etching, at the location of the zones 209.

The chip 200 may then be transferred, for example onto a printed circuit board, in a manner similar to that described for the chip 100. The cavity 210 and the trenches 214 then create mechanical decoupling within the connection location 202.

As for the chip 100 described above, the conducting portions 212 may form an electrical contact line between the connection location and the remainder of the chip 200 to carry electrical signals. Preferably, these electrical contact lines are covered by the passivation layer 205. It is also possible to perform a mechanical filtering function through the trenches, cavities and beam spring zones made at the connection locations of the chip 200 and/or by filling the trenches and the cavity at least partially by a plastic and/or viscous material and/or depositing a resin embedding the entire chip 200. This filter function may also be made when no material or fluid is deposited in the cavity or the trench, the air present in the trench and the cavity already damping vibrations applied to the chip and/or the support.

When mechanical decoupling is done on the support, the support may be formed from several layers, for example a lower metal-based layer is used as the sacrificial layer for creating a cavity, in a manner similar to production of the mechanical decoupling cavity previously made in the chip.

Figure 8:
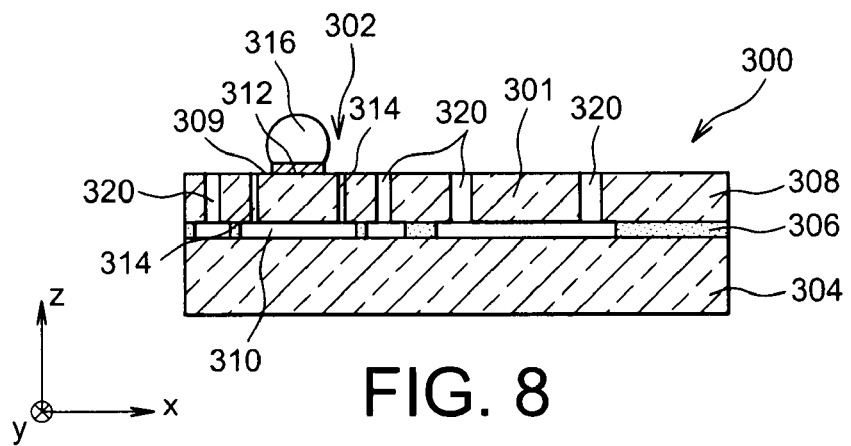
FIGS. 8 and 9A show sectional views of a chip with mechanically decoupled connection locations according to a third embodiment of this invention.
Figure 9A:
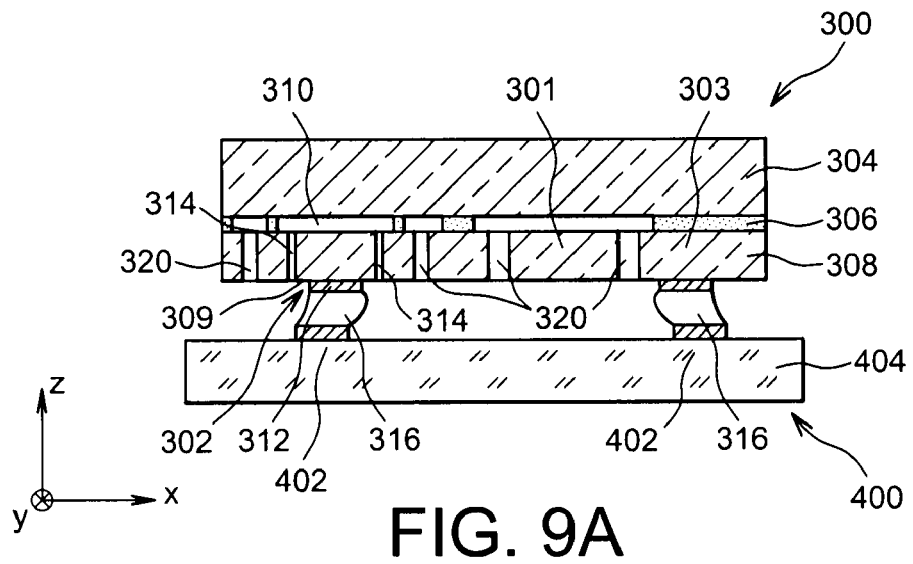
Figure 9B:
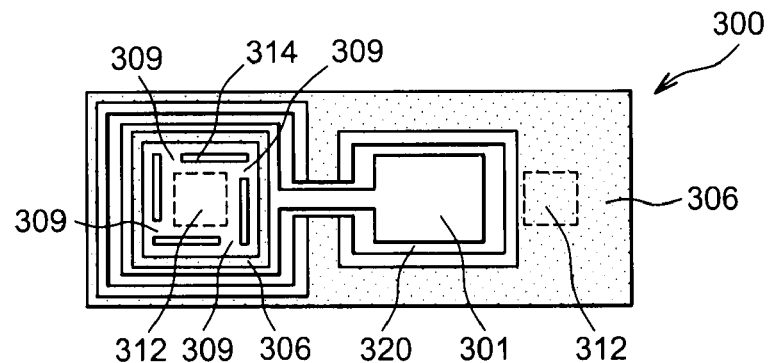
FIG. 9B shows a sectional top view of a chip with mechanically decoupled connection locations according to the third embodiment of this invention.

FIGS. 8, 9A and 9B show another example of chip 300 comprising a third embodiment of mechanically decoupled connection locations 302.

In particular, this chip 300 comprises a MEMS 301 made on an SOI substrate formed from a silicon-based layer 304 for example, a dielectric layer 306 for example based on silicon oxide, and an active silicon-based layer 308. This MEMS 301 may for example be an accelerometer, a gyrometer or a pressure sensor. The silicon in the active layer 308 may be sufficiently conducting to carry an electrical signal between the MEMS 301 and a connection location 302. To achieve this, this silicon may be doped by boron or phosphorus to obtain a resistivity less than a few ohm·cm (for example less than 9 ohm·cm or 5 ohm·cm). The doping level may also be chosen to be as large as possible while remaining below the material degeneration limit, for example a resistivity between about 1 milliOhm·cm and 900 milliOhm·cm, to maintain good mechanical quality of the silicon crystalline structure. Isolation trenches 320 providing electrical and/or mechanical isolation depending on the MEMS type, partly separate the MEMS 301 from the remainder of the active layer 308. FIG. 9B shows a sectional top view in the plane of the dielectric layer 306 of this chip 300. The active layer 308 may for example be between about 1 μm and 1 mm thick.

Mechanical decoupling trenches 314, for example similar to trenches 114 and 214 described above, are made in the MEMS 301. A cavity 310 made under the MEMS 301 also forms a mechanical decoupling cavity at the connection location 302. Mechanical decoupling zones 309 also forming beam spring zones corresponding to zones 109 and 209, contribute to mechanical decoupling of the connection location 302. Advantageously, the trenches 314 may be made by DRIE (Deep Reactive Ionic Etching).

A portion of a conducting material 312 is made on the MEMS 301 and is designed to provide continuity of the silicon contact and also to hold a first connection ball 316. Therefore, in this case the mechanically decoupled location is formed by part of the MEMS 301. As shown in FIG. 9A, the chip 300 is connected to a support 400 formed from a layer 404 through connection balls 316 previously made on the chip 300 and/or the support 400. On the example shown in FIG. 9A, connection locations 402 holding the connection balls 316 are not mechanically decoupled, unlike the connection location 302 formed in the chip 300. But in one variant embodiment, these connection locations 402 may be mechanically decoupled by at least one trench and at least one cavity formed in the layer 404 of the support 400, for example in a similar manner to the production of trenches and cavities formed in the chip described above. A second ball 316 is shown in FIG. 9A connecting the active layer 308 to the support 400. In this third embodiment, there is a connection location 303 made on the MEMS 301 that is not mechanically decoupled. In general, connection locations may be made on "passive" parts of the layer, in other words on parts that do not comprise any active device and/or on active parts, for example such as the MEMS 301.

The assembly of the chip 300 on the printed circuit board 400 may be similar to that described for the chip 100. The cavity 310 and the trenches 314 then create mechanical decoupling within the connection location 302 of the chip 300 shown in FIGS. 8, 9A and 9B.

As for chips 100 and 200 described above, the conducting portions 312 may also form contact bumps carrying electrical signals, in addition to their mechanical connection function. It is also possible that the trenches 314 and the cavity 310 may be filled with a material or a fluid performing a damping function for stresses applied at the connection location 302. A resin may also embed the entire component formed by the chip 300 and the support 400. The chip 300 may also be protected by a hermetically sealed cover, for example a Pyrex cover with an anodic seal, particularly when it is required that the chip should be placed in an environment under a vacuum.

The invention claimed is:

1. A component comprising:
   at least one chip configured to be transferred onto at least one support and connected, at a level of at least one connection location of the chip formed by at least one portion of a layer of the chip, to at least one connection location of the support formed by at least one portion of a layer of the support, through at least one ball,
   the chip comprising a mechanical decoupler of the chip connection location from the chip, formed by at least one cavity buried and made in the layer of the chip, under the connection location, and at least one trench, made in the layer, communicating with the cavity and partly surrounding the portion of the layer such that at least one zone of the layer connects the portion of the layer to a remainder of the layer and being made from at least one non-metallic material.

2. The component according to claim 1, wherein the trench is arranged around the periphery of the connection location of the chip and/or the connection location of the support.

3. The component according to claim 1, wherein the mechanical decoupler comprises at least four trenches made in the layer of the chip, making the cavity communicate with a face of the layer of the chip.

4. The component according to claim 1, wherein the trench comprises at least one comb pattern.

5. The component according to claim 1, wherein the mechanical decoupler further comprises at least one plastic or viscous material arranged in at least part of at least one of the trench or the cavity.

6. The component according to claim 1, wherein the connection location of the chip comprises at least one portion of an electrically conducting material, arranged on the portion of the layer of the chip.

7. The component according to claim 6, wherein the portion of the electrically conducting material forms an electrical contact between at least two elements of the component.

8. The component according to claim 6, further comprising at least one metallic track made on the chip, said at least one metallic track being electrically connected to the portion of conducting material.

9. The component according to claim 6, wherein the portion of the electrically conducting material is intended to form at least one part of an electrical contact between the chip and the support.

10. The component according to claim 1, wherein the chip comprises at least one MOS type device, at least one MEMS, at least one NEMS, or at least one MOEMS.

11. The component according to claim 1, wherein the mechanical decoupler is intended to perform mechanical filtering between the chip and the support.

12. The component according to claim 1, wherein the chip is made from a material for which the coefficient of thermal expansion is different from the coefficient of thermal expansion of the material from which the support is made.

13. The component according to claim 1, further comprising a material embedding the chip.

14. The component according to claim 1, wherein the non-metallic material of the zone comprises at least one of silicon, silicon oxide, or silicon nitride, or doped silicon with a resistivity of less than about 1 Ohm·cm.

15. A component comprising:
at least one support onto which at least one chip is configured to be transferred and connected, at a level of at least one connection location of the chip formed by at least one portion of a layer of the chip, to at least one connection location of the support formed by at least one portion of a layer of the support, through at least one ball,
the support comprising a mechanical decoupler of the support connection location from the support, formed by at least one cavity buried and made in the layer of the support, under the connection location, and at least one trench, made in the layer, communicating with the cavity and partly surrounding the portion of the layer such that at least one zone of the layer connects the portion of the layer to a remainder of the layer and being made from at least one non-metallic material.

16. The component according to claim 15, wherein the trench is arranged around the periphery of the connection location of the support.

17. The component according to claim 15, wherein the mechanical decoupler comprises at least four trenches made in the layer of the support, making the cavity communicate with a face of the layer of the support.

18. The component according to claim 15, wherein the trench comprises at least one comb pattern.

19. The component according to claim 15, wherein the mechanical decoupler further comprises at least one plastic or viscous material arranged in at least part of at least one of the trench or the cavity.

20. The component according to claim 15, wherein the connection location of the support comprises at least one portion of an electrically conducting material, arranged on the portion of the layer of the support.

21. The component according to claim 20, wherein the portion of the electrically conducting material forms an electrical contact between at least two elements of the component.

22. The component according to claim 20, further comprising at least one metallic track made on the support, said at least one metallic track being electrically connected to the portion of conducting material.

23. The component according to claim 20, wherein the portion of conducting material is intended to form at least one part of an electrical contact between the chip and the support.

24. The component according to claim 15, wherein the mechanical coupler is intended to perform mechanical filtering between the chip and the support.

25. The component according to claim 15, wherein the chip is made from a material for which the coefficient of thermal expansion is different from the coefficient of thermal expansion of the material from which the support is made.

26. The component according to claim 15, further comprising a material embedding the support.

27. The component according to claim 15, wherein the non-metallic material of the zone comprises at least one of silicon, silicon oxide, or silicon nitride, or doped silicon with a resistivity of less than about 1 Ohm·cm.

28. A component comprising:
at least one chip and one support, the chip being transferred onto the support and connected, at the level of at least one connection location of the chip formed by at least one portion of a layer of the chip, to at least one connection location of the support formed by at least one portion of a layer of the support, through at least one ball,
the chip comprising a mechanical decoupler of the chip connection location from the chip, formed by at least one first cavity buried and made in the layer of the chip, under the connection location, and at least one first trench, made in the layer of the chip, communicating with the first cavity and partly surrounding the portion of the layer of the chip such that at least one zone of the layer of the chip connects the portion of the layer of the chip to a remainder of the layer of the chip and being made from at least one non-metallic material,
the support comprising a mechanical decoupler of the support connection location from the support, formed by at least one second cavity buried and made in the layer of the support, under the connection location, and at least one second trench, made in the layer of the support, communicating with the second cavity and partly surrounding the portion of the layer of the support such that at least one zone of the layer of the support connects the portion of the layer of the support to a remainder of the layer of the support and being made from at least one non-metallic material.

* * * * *